(12) United States Patent
Xiao

(10) Patent No.: US 12,077,844 B2
(45) Date of Patent: Sep. 3, 2024

(54) METAL NANOPARTICLE SENSOR AND FABRICATION METHOD

(71) Applicant: Bo Xiao, Virginia Beach, VA (US)

(72) Inventor: Bo Xiao, Virginia Beach, VA (US)

( * ) Notice: Subject to any disclaimer, the term of this patent is extended or adjusted under 35 U.S.C. 154(b) by 638 days.

(21) Appl. No.: 16/819,107

(22) Filed: Mar. 15, 2020

(65) Prior Publication Data

US 2021/0285089 A1 Sep. 16, 2021

(51) Int. Cl.
| | |
|---|---|
| C23C 14/00 | (2006.01) |
| C23C 14/08 | (2006.01) |
| C23C 14/28 | (2006.01) |
| C23C 14/34 | (2006.01) |
| C23C 16/40 | (2006.01) |
| G01N 21/65 | (2006.01) |

(52) U.S. Cl.
CPC ............ *C23C 14/086* (2013.01); *C23C 14/28* (2013.01); *C23C 14/34* (2013.01); *C23C 16/407* (2013.01); *G01N 21/658* (2013.01)

(58) Field of Classification Search
CPC .................................................... C23C 14/00
See application file for complete search history.

(56) References Cited

U.S. PATENT DOCUMENTS

| | | | |
|---|---|---|---|
| 2004/0055892 A1* | 3/2004 | Oh .......................... | C25D 15/00 205/109 |
| 2010/0129623 A1* | 5/2010 | Johansson ............ | G01N 21/658 977/734 |
| 2016/0343887 A1* | 11/2016 | Hossain .............. | H01L 31/0392 |
| 2018/0222766 A1* | 8/2018 | Roqan ................ | H01L 21/02631 |
| 2019/0369040 A1* | 12/2019 | Drmosh ............. | G01N 33/0037 |

FOREIGN PATENT DOCUMENTS

KR 10-2015-0114144 * 10/2015

OTHER PUBLICATIONS

"VLS Growth of Highly Oriented SnO2 Nanorods and ZnO Hybrid Films for Gas Sensing Measurements", Christian G. Carvajal, C. Snow-Davis, R. Mundle, and A. K. Pradhan, Journal of the Electrochemical Society, 161 (2) B3151-B3154, (Year: 2014).*
"KR20150114144A", Google Patents, (Year: 2015).*
"Surface Modification and Charge Injection in a Nanocomposite of Metal Nanoparticles and Semiconductor Oxide", Bo Xiao, Gugu N. Rutherford, Amrit P. Sharma, Sangram K. Pradhan, Carl E. Bonner, Messaoud J. Bahoura, Scientific Reports, 10:4743, (Year: 2020).*
"NSC-4000 and NSC-3000 Sputter Coaters", (Year: 2000).*
"Fabrication and SERS Performances of Metal/Si and Metal/ZnO Nanosensors: A Review", G. Barbillon, Coatings 2019, 9, 86, (Year: 2019).*

(Continued)

*Primary Examiner* — Kelly M Gambetta
*Assistant Examiner* — Mohammad Mayy

(57) ABSTRACT

The present disclosure relates to a metal nanoparticle sensor and fabrication method thereof. The metal nanoparticle sensor includes a SERS substrate, comprising a substrate, metal oxide nanostructures formed on the substrate, and metal nanoparticles grown on the metal oxide nanostructures. The metal oxide nanostructures include crystal facets. The metal nanoparticles substantially cover the crystal facets and the metal nanoparticles are grown in a vacuum chamber at an elevated substrate temperature.

19 Claims, 7 Drawing Sheets

(56) References Cited

OTHER PUBLICATIONS

"Improving correlated SERS measurements with scanning electron microscopy: an assessment of the problem arising from the deposition of amorphous carbon", Christine H. Moran, Xiaohu Xia and Younan Xia, Phys. Chem. Chem. Phys., 15, 5400, (Year: 2013).*
"Doubly Localized Surface Plasmon Resonance in Bimodally Distributed Silver Nanoparticles", M. Ranjan, J. Nanosci. Nanotechnol. 2012, vol. 12, No. 6, (Year: 2012).*
"Synthesis of metal and metal oxide nanostructures and their application for gas sensing", N.M. Shaalan, T. Yamazaki, T. Kikuta, Materials Chemistry and Physics 127,143-150, (Year: 2011).*
"Dopant controlled photoinduced hydrophilicity and photocatalytic activity of SnO2 thin films", Talinungsang, Debarun Dhar Purkayastha, M. Ghanashyam Krishna, Applied Surface Science 447, 724-731 (Year: 2018).*

* cited by examiner

METAL NANOPARTICLE SENSOR AND FABRICATION METHOD

TECHNICAL FIELD

The present disclosure relates to nanofabrication and Raman spectroscopy technologies, and in particular, to a metal nanoparticle sensor and a fabrication method thereof.

BACKGROUND

Surface-enhanced Raman spectroscopy (SERS) is a highly sensitive analytical technique that enables the detection of chemical or biological analytes in trace amount. Amplified Raman scattering signals attribute to such detection enhancement where analytes are usually applied to rough metal surfaces. The enhancement of electromagnetic fields caused by the excitation of localized surface plasmon resonances (LSPRs) is generally considered as the primary mechanism for most SERS. Theoretical calculations revealed that the electromagnetic enhancement factor could be up to ~$10^{10}$-$10^{12}$, reaching the sensitivity high enough for single molecule detection. Most importantly, SERS provides an accessible and flexible tool to boost the performance of the conventional Raman spectrometers, especially to meet the emerging demands in portable and mobile applications for medical diagnostics, environmental monitoring, food safety, national security, and rapid screening.

Noble metal nanoparticles typically exhibit SERS enhancement at sharp edges or gaps between metallic protrusions, called hot spots. Hot spots concentrate electromagnetic radiation energy within small areas, which account for the majority of the Raman scattering signals from SERS. Because the near-field behavior dominates the concentrated electromagnetic radiation in the hot spots, the field strength, as well as associated SERS enhancement, declines rapidly within the distance of a few nanometers. Hot spots between the nanostructure gaps should be sufficiently small. High-density hot spots are desired to ensure consistent detection across the surface of a SERS substrate. In addition, approaches based on superhydrophobic surfaces and chemical enhancement have been pursued to push the limit of the SERS sensitivity. Covering a premade nanostructure template with a noble metal is a method to produce SERS substrates. The morphology of the nanostructure template substantially determines the resulted size and roughness of the noble metal coated on the nanostructures. Therefore, the technique lacks the ability to control the structural properties of the noble metal. High-density noble metal nanostructures also pose stringent requirements for the nanofabrication.

BRIEF SUMMARY

An embodiment of the present disclosure provides a metal nanoparticle sensor. The metal nanoparticle sensor includes a SERS substrate, which comprises a substrate, metal oxide nanostructures formed on the substrate, metal nanoparticles grown on the metal oxide nanostructures. The metal oxide nanostructures comprise crystal facets. The metal nanoparticles substantially cover the crystal facets and the metal nanoparticles are grown in a vacuum chamber at an elevated substrate temperature.

Optionally, the metal oxide nanostructures may be crystalline and grown on the substrate through a nucleation process.

Optionally, the metal oxide nanostructures may include sharp tips formed during the nucleation process.

Optionally, the elevated substrate temperature is approximately in a range of 100° ° C. to 300° C.

Optionally, the metal nanoparticles may include aluminum, gold, silver, copper, platinum, or alloy thereof.

Optionally, a majority of the metal nanoparticles may have a size less than 100 nm.

Optionally, adjacent metal nanoparticles may have gaps and a majority of the gaps may have a distance less than 30 nm.

Optionally, electrons may be injected in the SERS substrate.

Optionally, the SERS substrate may be exposed by electrons or UV light before using.

Optionally, the metal oxide nanostructures may include aluminum oxide, titanium oxide, zirconium oxide, zinc oxide, cesium oxide, or mixture thereof.

Optionally, the metal nanoparticles may include gold, silver, or alloy thereof, grown at the elevated substrate temperature in a range of 150° C. to 300° ° C. and a deposition rate of 0.5 nm/s.

Optionally, the SERS substrate may be hydrophobic or superhydrophobic.

Another embodiment of the present disclosure provides a method of fabricating a SERS substrate. The SERS substrate includes: providing a substrate; forming metal oxide nanostructures on the substrate; heating the substrate over 50° C. in a vacuum chamber; and depositing a metal in the vacuum chamber to grow metal nanoparticles on the metal oxide nanostructures at an elevated substrate temperature.

Optionally, after depositing the metal in the vacuum chamber to grow the metal nanoparticles on the metal oxide nanostructures at the elevated substrate temperature, the method may include a step of exposing the SERS substrate under electrons or UV light before collecting Raman signals.

Optionally, immediately after depositing the metal in the vacuum chamber to grow the metal nanoparticles on the metal oxide nanostructures at the elevated substrate temperature, the method may include a step of increasing the elevated substrate temperature by about 100 to 200° ° C. to anneal the SERS substrate in the vacuum chamber.

Optionally, forming the metal oxide nanostructures on the substrate may be a growing process through nucleation.

Optionally, a base pressure of the vacuum chamber may be below $10^{-6}$ Torr before heating the substrate over 50° C. in the vacuum chamber.

Optionally, the elevated substrate temperature may be approximately in a range of 100° C. to 300° C.

Optionally, depositing the metal may be set at a constant deposition rate.

Optionally, the metal may include aluminum, gold, silver, copper, platinum, or alloy thereof.

DETAILED DESCRIPTION

Combining two materials at a nanoscale level can create a composite with new functionalities and also change some of their physical and chemical properties. Metal nanoparticles are grown on the metal oxide nanostructures. Volmer-Weber growth, though unfavorable for thin films, promotes nucleation of dense and isolated metal nanoparticles on the metal oxide nanostructures, resulting in new material properties. The nanocomposite shows a remarkable sensitivity to detect traces of analytes in surface-enhanced Raman spectroscopy. Metal nanoparticles with tunable size can modify surface wettability and convert hydrophilic oxide surfaces to hydrophobic and even superhydrophobic surfaces. In addition, charge injection through electron or ultraviolet light exposure shows the effect similar to photo-induced charge separation, providing a further boost to the Raman enhancement.

Figure 1:
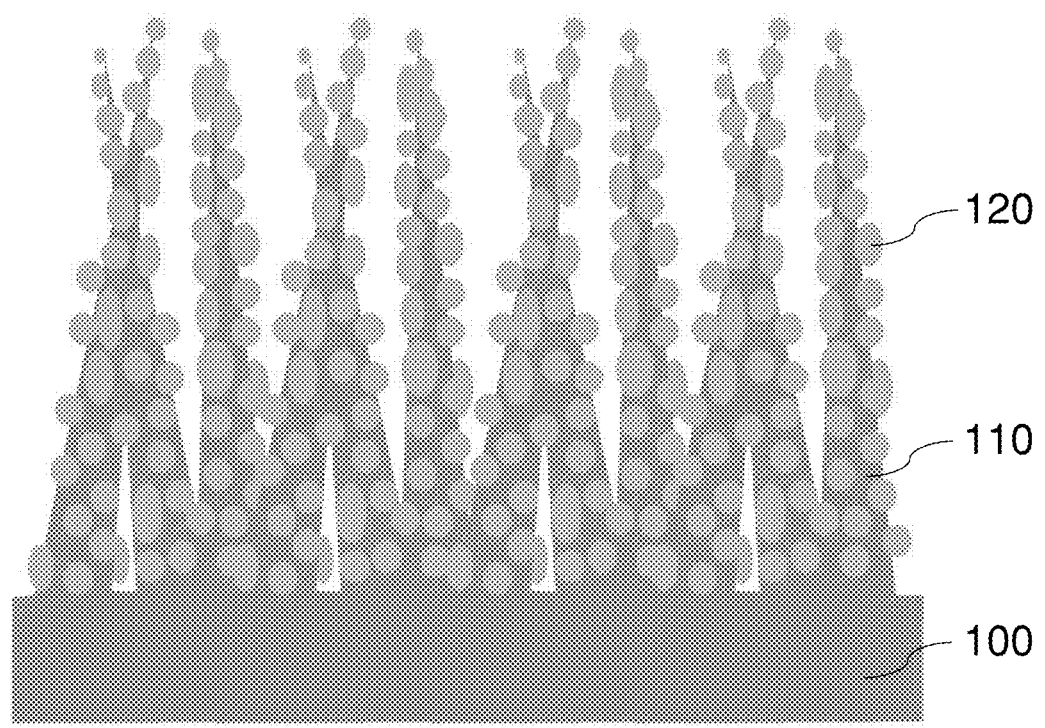
FIG. 1 illustrates a metal nanoparticle sensor according to one embodiment of the present disclosure.

One embodiment of the present disclosure provides a metal nanoparticle sensor, comprising metal nanoparticles grown on metal oxide nanostructures. FIG. 1 illustrates the metal nanoparticle sensor. In one embodiment, the metal nanoparticle sensor includes a SERS substrate. Metal oxide nanostructures 110 are nanometer-scale crystals grown on a substrate 100 via chemical vapor deposition (CVD) or physical vapor deposition (PVD). A subsequent metal deposition grows metal nanoparticles 120 on the facets of the metal oxide nanostructures 110. The growth of the metal oxide nanostructures involves the crystal nucleation that forms crystalline facets. Because of the slow growth along some crystal orientation, crystal facets are formed in many crystal structures that have a specific arrangement of close-packed atoms. In principle, a stable crystal structure tends to expose the smooth facets with the lowest surface energy and fewer dangling bonds.

Figure 2A:
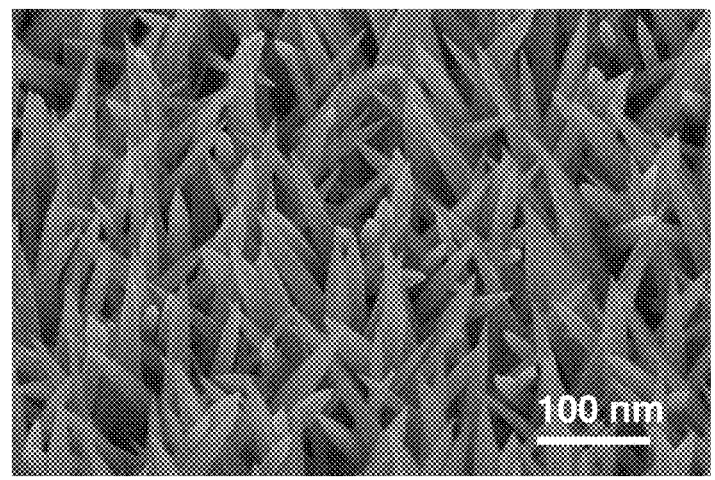
FIG. 2A shows a scanning electron microscope (SEM) image of metal oxide nanostructures and FIG. 2B shows x-ray diffraction spectra of metal oxide nanostructures.

Many metal oxides can be grown by CVD or PVD to obtain crystalline nanostructures with the smooth facets. Size, shape, and geometry of these nanostructures play an essential role in the sensing performance of SERS. In one embodiment, tin oxide ($SnO_2$) is used to produce metal oxide nanostructures. Tin oxide is a versatile optical and electrical material that has a broad range of applications in sensing, energy storage, and harvesting applications. There are various methods to synthesize $SnO_2$ nanostructures. Among them, chemical vapor deposition (CVD) offers many options for customizing precursors. The method based on vapor-solid growth mechanism can be employed to synthesize $SnO_2$ nanostructures on a substrate such as silicon and glass. The synthesis method usually produces an obelisk-like crystal nanostructure that is four-sided with a tapering sharp tip as shown in FIG. 2A.

Figure 2B:
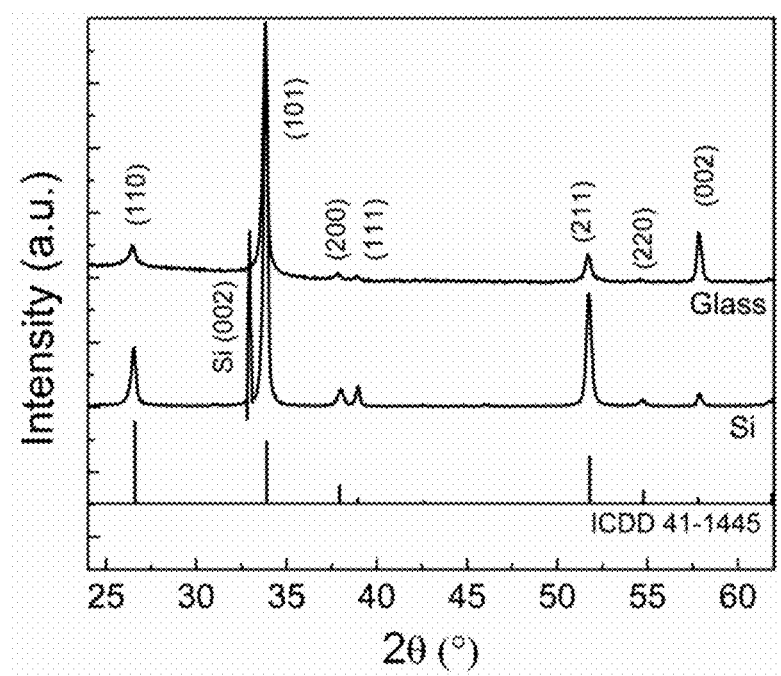

High-resolution X-ray diffraction (HRXRD) scans examined the structural properties of $SnO_2$ nanostructures. FIG. 2B presents the 2θ diffraction scanning patterns that reveal the primary peaks of the (110), (101) and (211) orientations, corresponding to the 2θ angles of 26.65°, 33.96°, and 51.84°, respectively. The positions of the peaks closely match the ones in the tetragonal $SnO_2$ with P42/mnm space symmetry group and lattice parameters of a=4.7382 Å and c=3.1871 Å. The peak intensity and sharpness indicate high crystallinity of the $SnO_2$ structures and the preferable (101) orientations. Although the size, length, and density of $SnO_2$ nanostructures may vary depending on the composition ratio of the precursors. $SnO_2$ nanostructures on glass and Si substrates share similar crystallinity and diffraction patterns. The size, shape and geometry of these nanostructures depend on the crystal evolution during the nucleation that is a complicated interplay among temperature, particle flux, and atomic surface diffusion. Changing the amount of $SnO_2$ precursor (e.g., $SnCl_2$ or $SnCl_4$) affects the particle flux during the growth, which may result in different crystal structures of $SnO_2$ nanostructures even at the same growth temperature. Nanostructures with the sharp tips are preferable for a SERS substrate.

The growth of metal nanoparticles 120 on metal oxide nanostructures 110 involves control of growth temperature and deposition rate. Metals, especially SERS active metals such as Au and Ag, have poor adhesion on the facets of crystalline metal oxides. Typically, metals grown by PVD evaporation process tends to aggregate on the corners and edges of metal oxide nanostructures or in the valleys between them as shown in FIG. 3a. To obtain metal nanoparticles on the facets, the growth conditions need to be adjusted to meet certain requirements. First, the PVD growth chamber is under vacuum and the preferable base growth pressure is below $10^{-6}$ Torr. Under the vacuum condition, metal atoms sputtered or evaporated have a long mean free path with a line-of-sight impingement to the substrate. Next, the growth temperature may be high enough to promote the atomic surface diffusion of metal atoms and compensates the shadowing effect. The term "growth temperature" refers to the substrate temperature. The process heats up the substrate to increase the surface energy of the crystal facets and allows metal atoms to diffuse and grow on exposed facets of the metal oxide nanostructures. Furthermore, the growth rate may be low enough to promote the formation of separated metal nanoparticles and avoid aggregation of the nanoparticles. The term "growth rate" refers to the metal thickness grown on a flat substrate in a given time. In PVD growth, the growth rate generally can be monitored by a quartz crystal monitor. Although the thickness detected by the quartz crystal monitor is designed to indicate the film thickness on a flat substrate, empirical thickness data can be used as a reference to control the size of the metal nanoparticles grown on the metal oxide nanostructures.

The process of growing metal nanoparticles involves heterogeneous growth and nucleation of metal vapor in a condensed phase. Growing a metal is different from coating a metal on nanostructures where the nanostructures in coating only act as a supporting material to introduce nanoscale roughness for the metal. In contrast to coating, the growth process seeks to form metal nanoparticles with the distinct morphology that is independent on the structural feature of the nanostructures. PVD is one of the popular techniques for depositing metals. Whereas metal deposition at room temperature is generally considered to be a simple coating process, the growth of metal nanoparticles requires a more precise control of the deposition condition such as substrate temperature and deposition rate.

Figure 3:
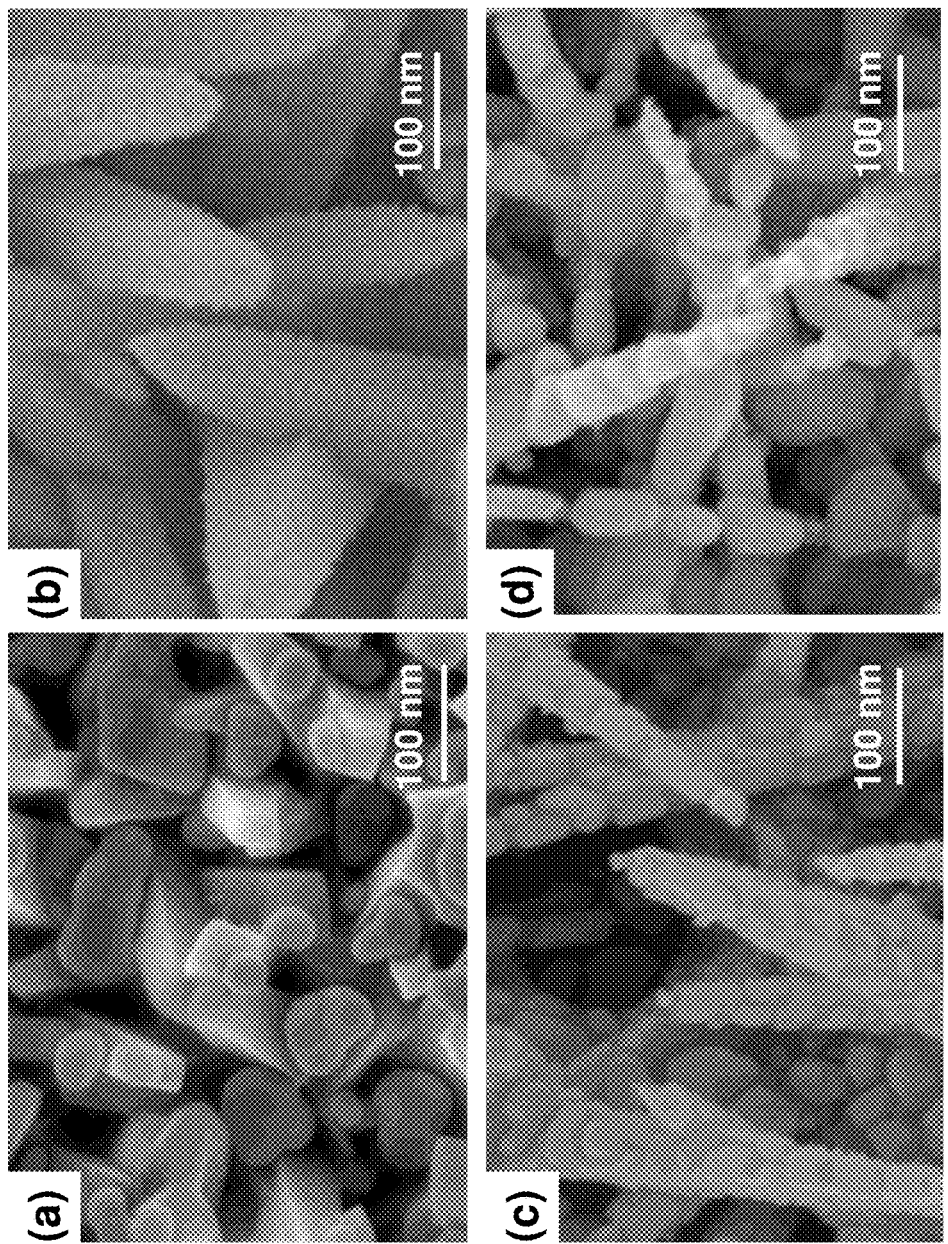
FIG. 3 shows SEM images of metal nanoparticles deposited on metal oxide nanostructures under different growth conditions.

FIG. 3 presents scanning electron microscopy (SEM) images to reveal the morphological evolution of Au nanoparticles grown at a substrate temperature Ts and a deposition rate D. Deposited at the room temperature, most of the Au particles aggregate in the valleys of $SnO_2$ nanostructures and their sizes vary in a wide range from 20 nm to 200 nm as shown in FIG. 3a. It is a common issue because of the poor adhesion of Au and low surface energy of the crystalline oxides. To improve the adhesion, the substrate is heated during the deposition to increase the surface diffusion and slow the solidification rate of impinging particles, which allows Au to make better contact with the $SnO_2$ surfaces. Furthermore, impinging Au atoms have a long mean free path with a line-of-sight impingement onto the substrates. Heating the substrates helps the atomic surface diffusion of Au atoms and reduces the shadowing effect. Therefore, Au atoms can absorb, diffuse, and grow on the facets of individual crystalline facets of the nanostructures.

The improved adhesion was observed as the Ts was over 50° C. The nanoparticle growth can be considered as a particular growth mode (island or Volmer-Weber) of thin film deposition. To avoid a layer-by-layer growth or aggregation, the growth parameters are calibrated to optimize the growth condition. Dense and isolated Au nanoparticles can be obtained at the substrate temperate T's in a range of 100 to 300° C. with the deposition rate D of ~0.5 nm/s. FIG. 3b shows the improved surface coverage of Au nanoparticles that were grown at 300° ° C. of Ts. The growth lasted less than 100 seconds at a deposition rate of 0.5 Å/s, roughly equivalent to 5 nm film thickness, which yielded the nanoparticles in the size of about 10 to 20 nm. At the same deposition rate and growth temperature, the growth time can be used to control the nanoparticle size. As for the equivalent 10 nm and 20 nm growth, larger particles in the ranges of 30 to 60 nm and 50 to 120 nm were formed on the facets of the $SnO_2$ as shown in FIGS. 3c and 3d.

The growth method enables a simple control of the nanoparticle size and the formation of high-density metal nanoparticles. Most nanoparticles have a size less than 100 nm so that each small metal nanoparticle can be a hot spot, capable of concentrating electromagnetic radiation energy within small areas for enhancing Raman scattering signals. Meanwhile, there are gaps between adjacent metal nanoparticles. High-density metal nanoparticles create very small gaps between themselves, which also work as hot spots to significantly improve the sensitivity of SERS. The majority of the gaps have a distance less than 30 nm.

Figure 4:
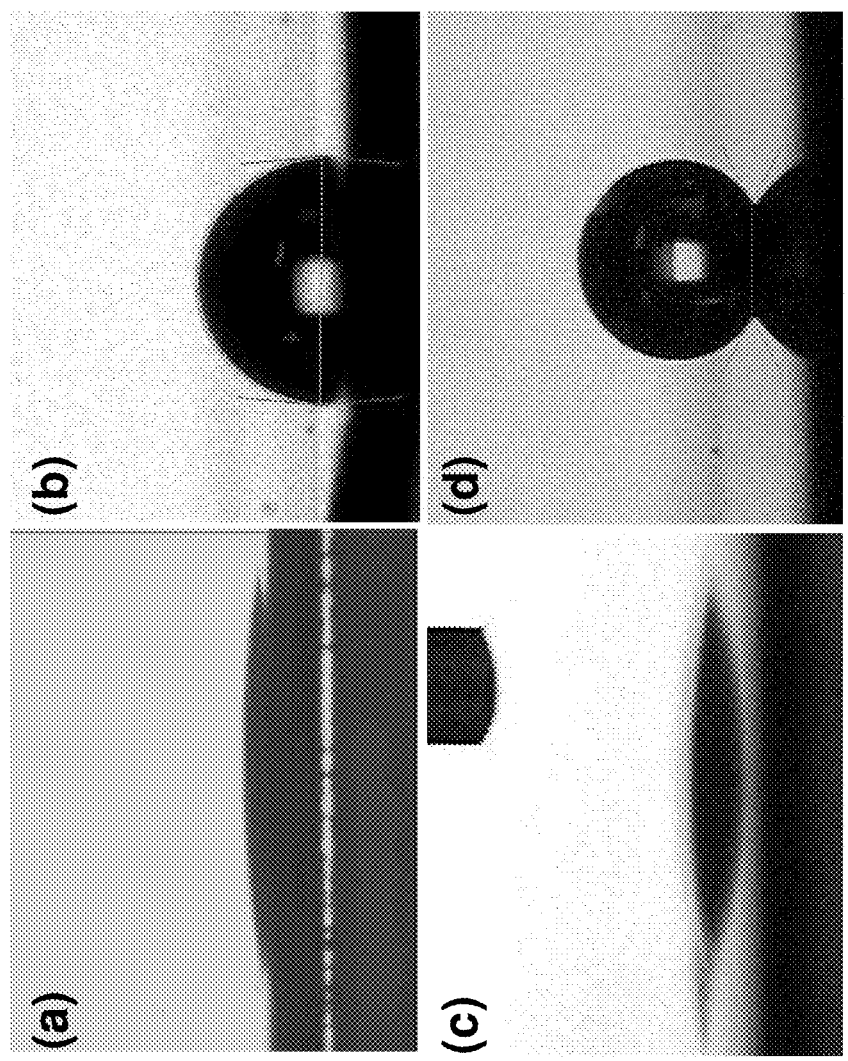
FIG. 4 shows contact angle measurements.

Metal nanoparticles substantially covers the surfaces of the metal oxide nanostructures as shown in FIGS. 3 (b), (c), and (d) as compared to FIG. 3 (a). The improved coverage of metal nanoparticles on oxide nanostructures macroscopically alters the surface properties. Wettability, one of the essential surface properties is a direct measure of hydrophobicity and hydrophilicity or surface energy that is an important factor affecting functional interfaces in various chemical and biological processes that occurred on the surfaces. FIG. 4 presents contact angle measurements to demonstrate the modification of surface wettability by means of the structure control of nanoparticles grown on oxide nanostructures. Generally, $SnO_2$ thin films or nanostructures have hydrophilic surfaces. The hydrophilic behavior can be seen in FIG. 4a where the water droplet spreads out on the surface. The tapering tips of $SnO_2$ nanostructures is not an ideal support structure to the water droplet. The surface energy of the facets plays a critical role in the wettability. Because of the dominant (101) surfaces with relatively large surface energy (surface free energy of the $SnO_2$ crystal faces: (001)>(101)>(100)>(110)), water can penetrate into the nanostructures along their (101) surfaces. Although Au thin films have a larger contact angle (~80°) (FIG. 4b), $SnO_2$ deposited with Au at the ambient temperature showed no signs of the improved wettability (FIG. 4c). At an elevated substrate temperature, the formation of Au nanoparticles and their improved coverage completely change the hydrophilic surfaces. $SnO_2$ nanostructures with Au nanoparticles grown at the substrate temperature of 200° ° C. shows a superhydrophobic state with the contact angle of 152.4° (standard deviation 1.2°) as shown in FIG. 4d.

The coverage of Au nanoparticles reduces the exposed $SnO_2$ surfaces, which lowers the surface energy and induces the transition from hydrophilicity to hydrophobicity or super-hydrophobicity. Most importantly, the gaps between Au nanoparticles can trap air and let the water drop sit partially on air that enhances hydrophobicity according to the Cassie model. Increasing the nanoparticle size or the aggregation may reduce the trapped air and thus affect the contact angle. For 15 nm and 20 nm Au deposition, the contact angles were about 135° and 122°, respectively.

Another important aspect of SERS is to bring analytes close to the hot spots in trace amount detection. A major advantage of the metal nanoparticles and oxide nanostructure composite is the three-dimensional distribution of the SERS active nanoparticles that increases the chance of contact between the analytes and the hot spots.

In order to evaluate the potential of SERS performance, two chemicals, trans-1,2-bis-(4-pyridyl) ethylene (BPE) and rhodamine 6G (R6G) were used for the SERS measurements. Two methods for sample preparation were implemented in the measurements. One method is to drop-cast a solution-based analyte and wait for it dry before acquiring Raman spectra, and the other is to immerse a SERS substrate in a solution-based analyte during the acquisition. Nonaqueous liquid, ethanol was used to dissolve and dilute the test analytes. Because of low surface tension in ethanol, a drop of the ethanol solution spreads out and evaporates rapidly on the SERS substrates, which in practice is more desirable for simple and fast detection. In the drop-cast preparation, 8 μl ethanol solutions with various analyte concentrations are applied to the SERS substrates. In immersion preparation, the substrates are submerged in a disposable sample box (26 mm×26 mm) with 1.5 mL of an analyte solution.

Figure 5:
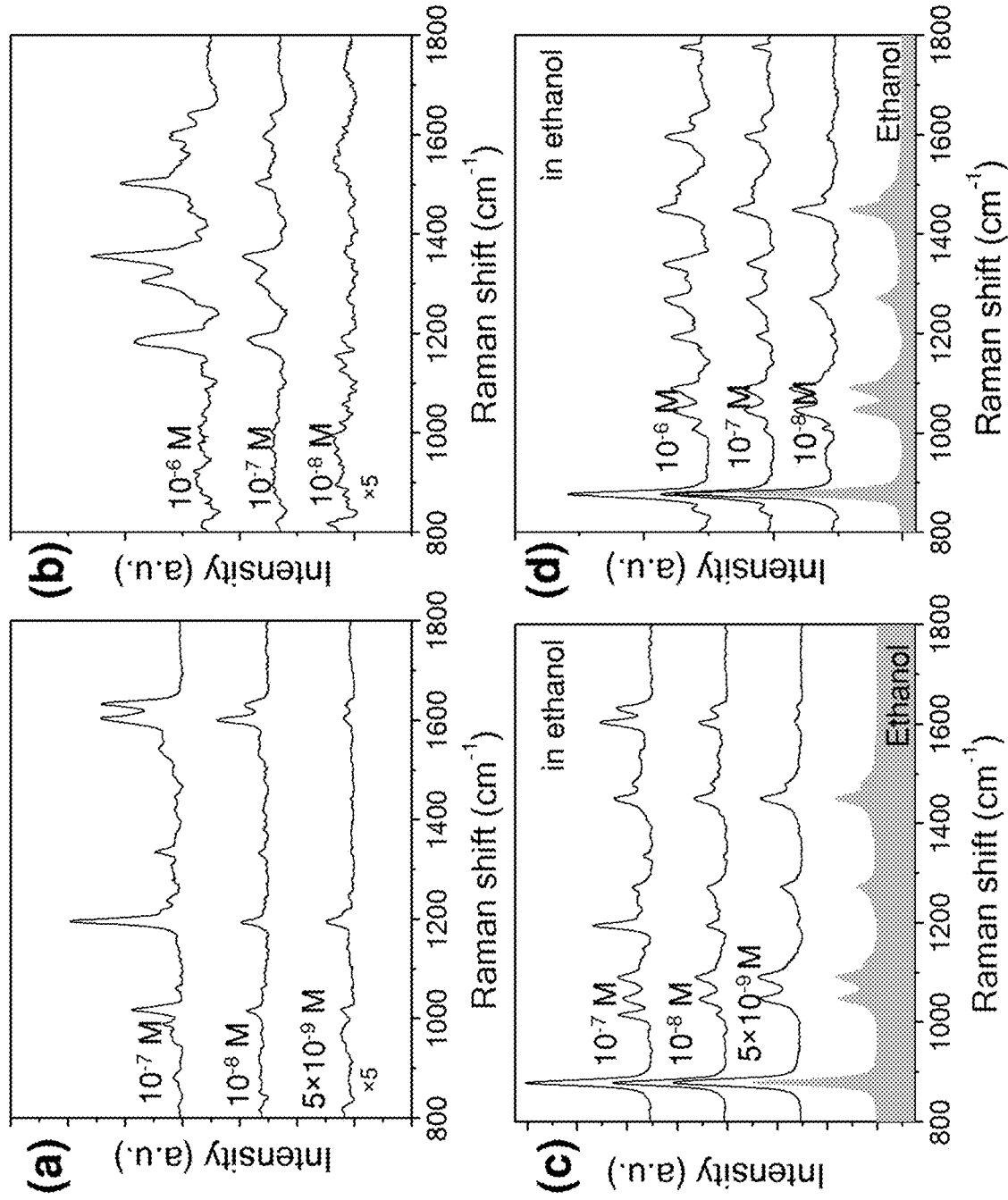
FIG. 5 shows Raman shift spectra.

FIG. 5 shows the Raman spectra of BPE and R6G using the two preparation methods. Raman spectra were acquired by a Raman system using a 785 nm laser with an accumulation time of 2 seconds. The observed peak positions of Raman spectra are in good agreement with the previous reports. The systematic measurements demonstrate the metal nanoparticles on the oxide nanostructures can achieve the detection of analytes at concentrations down to $5\times10^{-9}$ M (BPE) and $1\times10^{-8}$ M (R6G). In the measurement, SERS performance is consistent in Au nanoparticles grown at 200° C. with an equivalent growth thickness of about 10 to 20 nm. Furthermore, SERS performance depends on the laser wavelength and the kind of noble metal. Ag nanoparticles can achieve similar SERS performance at the excitation wavelength of a 532 nm laser.

SERS efficiency for detecting low concentration analytes in aqueous solution is also improved with the superhydrophobic surface, which holds a drop of the aqueous solution onto a small area. As the solution evaporates, the accumulation enriches the analytes that make contact with the high-density metal nanoparticles.

The composite of a plasmonic metal and an oxide material is a heterostructure that further enhances Raman signals because electrons can accumulate in the plasmonic metal. Photo-irradiation can induce electron accumulation, resulting in high electron density and net charges. The effect involves charge transferring and separation in the heterostructure. Chemical enhancement from photogenerated electrons is a possible explanation of the enhanced Raman signals. The mechanism of the charge behavior may also be attributed to Schottky contacts and semiconductor photocatalysis. Many metal oxides possess semiconducting properties. Electrons are excited from the valence band (VB) to conduction band (CB) in the semiconductor. If a metal with the work function W is in contact with the semiconductor, the excited electrons can spill over from the semiconductor into the metal and then be trapped in the metal owing to the Schottky barrier. Ultraviolet (UV) light irradiation is a method to generate electron-hole pairs from the semiconductor. Because of the large bandgap and bulk recombination in the oxide semiconductors, it usually takes a long time for UV light irradiation to effectively excite and inject electrons into the plasmonic metals. Since net charges are the main factor to affect this extra enhancement, the metal nanoparticles and oxide nanostructures may be exposed under an electron beam (e.g., electron microscope or electron gun) to inject electrons into the plasmonic nanoparticles directly.

Figure 6:
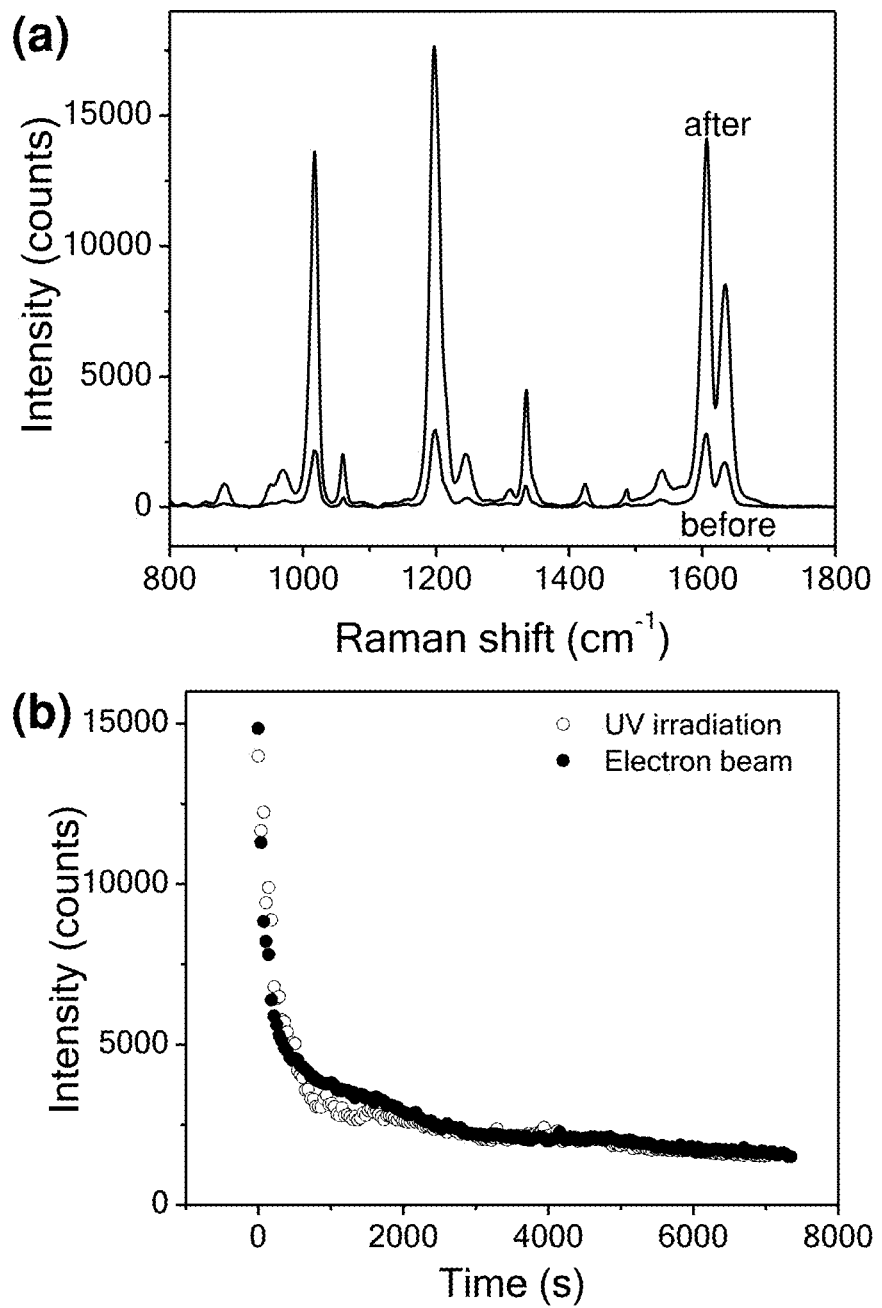
FIG. 6 shows the Raman measurement results of metal nanoparticles exposed by UV irradiation and electron beam.

FIG. 6 shows the results of the enhanced Raman signals using charge injection. In the UV irradiation, the SERS substrates with the analyte were exposed under 254 nm light. The exposure time depends on the power of the UV source. Because the energy bandgap $E_g$ of $SnO_2$ is 3-4 eV, the UV light with 254 nm (4.9 eV) wavelength is higher than the $E_g$ of $SnO_2$ but out of the range for exciting surface plasmons. The electron-hole pairs generated by the UV radiation are more likely to inject electrons from the $SnO_2$ into the Au nanoparticles. In the electron injection, the substrates were scanned/exposed by an electron beam (e.g., scanning electron microscope). For example, the substrates can be placed on an insulating glass side and loaded into the electron microscope under the electron beam exposure (or scanning) for 5 min at 1 μA and 5 kV.

Raman measurements were carried out shortly after the exposure to minimize the charge dissipation. $10^{-7}$ M BPE was used as a standard analyte to investigate the influence before and after the charge injection. In the analysis, both charge injection methods (UV irradiation and electron injection) yielded a large enhancement factor, and the average intensities of Raman peaks came up to one order of magnitude higher than those of the unexposed. Therefore, the metal nanoparticle sensors can be exposed under UV light or electrons before collecting Raman signals to increase the sensitivity.

FIG. 6b shows Raman spectra collected from a repetitive scanning with a time interval of 30 s at the same spot. The peak intensity (1190 cm$^{-1}$ BPE) drops instantly once the measurement starts. The spectra from UV irradiation and electron beam exposure bear a close resemblance of the time dependence (FIG. 6b). The intensity decay indicates a reverse charge flow bringing excess electrons back to the oxide or dissipation in air. The inverse effect induced by the Raman laser suggests the charge separation of plasmon hot carriers in the plasmonic nanostructures. The net charges increase the electron density in the metal nanoparticles. Surface plasmons excited by Raman lasers can transfer energy to the electrons and generate hot electrons with energy higher than the Schottky barrier. Thus, continuously collecting Raman spectra from the same spot accelerates the deterioration of the enhancement. Moreover, a continuous Raman acquisition in a short time generates heat on the sample surface, and the accumulated heat also accelerates the charge dissipation. Without Raman laser exposure, the metal nanoparticle sensors exposed by the UV irradiation or electron beam can maintain the charge induced Raman improvement after days stored in the dark.

Elevated growth temperature of the substrate and smooth crystalline facets of metal oxide nanostructures play a vital role in promoting metal nanoparticles nucleation. So, with crystalline surfaces, many metal oxide nanostructures as well as metal oxide thin films can be used to grow metal nanoparticles for SERS applications. There are suitable candidates such as aluminum oxide ($Al_2O_3$), titanium oxide ($TiO_2$), zirconium oxide ($ZrO_2$), zinc oxide (ZnO), cerium oxide ($CeO_2$) and so on. Metal compounds such as metal nitrides and metal sulfides can form nanostructures with stable crystalline facets, which are also suitable for the purpose. Besides smooth surfaces in the crystalline nanostructures, insulating or semiconducting property also benefit the charge separation in UV and electron beam exposure to further enhance the sensitivity of the metal nanoparticle sensors.

Another embodiment of the present disclosure provides a method for fabricating a metal nanoparticle sensor. The method includes growing metal nanoparticles on metal oxide nanostructures at an elevated substrate temperature. The growing method may be physical vapor deposition (PVD) such as DC sputtering, thermal, and electron beam evaporation.

Figure 7:
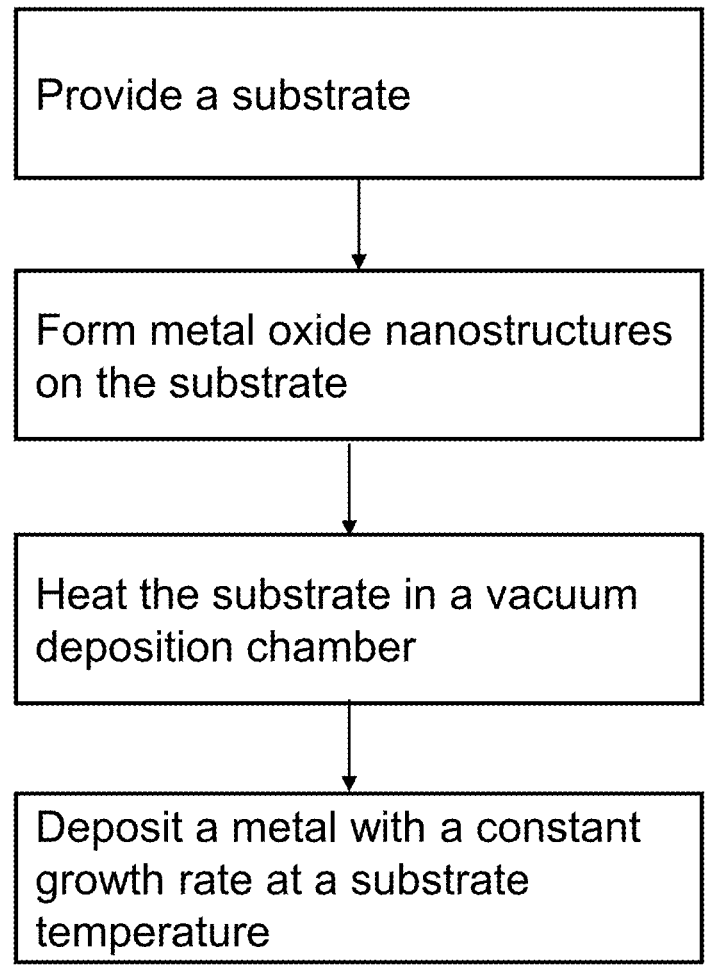
FIG. 7 is a flowchart of a method for fabricating metal nanoparticles on metal oxide nanostructures according to one embodiment of the present disclosure.

As shown in FIG. 7, the method includes the following steps: providing a substrate; growing metal oxide nanostructures on the substrate; heating the substrate in a vacuum deposition chamber; and depositing a metal with a growth rate at an elevated substrate temperature. The substrate is not limited to the commonly used semiconductor wafers (e.g. Si and sapphire), and metal and glass that tolerate the heat and chemical conditions in metal oxide and nanoparticles growth are suitable materials for the substrate. Metal oxide nanostructures are grown on the substrate. Contrary to the etching process in nanofabrication, growing metal oxide nanostructures is an additive nucleation process that occurs in the formation of a crystalline structure from a solution or a vapor. Nucleation creates more stable, more consistent and smoother metal oxide surfaces than the etching process does. Such crystal surfaces facilitate the subsequent formation of separate metal nanoparticles. The growth of metal nanoparticles is carried out in a vacuum deposition chamber to prevent contamination and oxidation. Before the metal nanoparticle growth, the base pressure of the vacuum chamber is below $10^{-6}$ Torr and the substrate is heated over 50° C. For Au or Ag nanoparticles, the substrate temperature is approximately in a range of 100 to 300° C. At the elevated substrate temperature, the metal deposition rate may be set about 0.5 Å/s. The growth time may vary depending on the average size of metal nanoparticles and the related SERS performance. After the metal deposition is finished, the substrate may be left in the vacuum chamber for an annealing process. The substrate temperature during the annealing process may be about 100 to 200° C. higher than the one during the metal deposition.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure but not limited to similar features.

What is claimed is:

1. A method of fabricating a SERS (surface-enhanced Raman spectroscopy) substrate, comprising:
   providing a substrate;

forming metal oxide nanostructures on the substrate, wherein the metal oxide nanostructures are crystalline with crystal facets;

heating the substrate formed with the metal oxide nanostructures to over 50° C. in a vacuum chamber; and depositing a metal in the vacuum chamber after the substrate reaches an elevated substrate temperature over 50° C., to grow metal nanoparticles on the crystal facets of the metal oxide nanostructures at the elevated substrate temperature;

wherein, during depositing the metal in the vacuum chamber, the substrate is maintained at the elevated substrate temperature.

2. The method according to claim 1, after depositing the metal in the vacuum chamber to grow the metal nanoparticles on the metal oxide nanostructures at the elevated substrate temperature, further comprising exposing the SERS substrate under electrons before collecting Raman signals.

3. The method according to claim 1, immediately after depositing the metal in the vacuum chamber to grow the metal nanoparticles on the metal oxide nanostructures at the elevated substrate temperature, further comprising increasing the elevated substrate temperature to an annealing temperature to anneal the SERS substrate in the vacuum chamber; wherein the annealing temperature is higher than the elevated substrate temperature, the annealing temperature is in a range of 100° C. to 200° C., and the substrate is maintained within the range to anneal the SERS substrate in the vacuum chamber.

4. The method according to claim 1, wherein forming the metal oxide nanostructures on the substrate is a growing process through nucleation.

5. The method according to claim 1, wherein a base pressure of the vacuum chamber is below 106 Torr before heating the substrate over 50° C. in the vacuum chamber.

6. The method according to claim 1, wherein the elevated substrate temperature is in a range of 100° C. to 300° C.; and
the elevated substrate temperature is maintained within the range during depositing the metal in the vacuum chamber.

7. The method according to claim 1, wherein depositing the metal is set at a constant deposition rate.

8. The method according to claim 1, wherein the metal comprises aluminum, gold, silver, copper, platinum, or alloy thereof.

9. The method according to claim 1, wherein the metal oxide nanostructures comprise hydrophilic surfaces.

10. The method according to claim 4, wherein the metal oxide nanostructures comprise sharp tips formed during the nucleation.

11. The method according to claim 1, where the metal oxide nanostructures are tin oxide nanostructures.

12. The method according to claim 1, where the metal oxide nanostructures are hydrophilic, and the SERS substrate is hydrophobic or superhydrophobic.

13. The method according to claim 1, wherein, during depositing the metal in the vacuum chamber, a base growth pressure of the vacuum chamber is below $10^{-6}$ Torr.

14. The method according to claim 1, wherein depositing the metal in the vacuum chamber is carried out by an evaporation process.

15. A method of fabricating metal nanoparticles on metal oxide nanostructures, comprising:
providing a substrate;
forming metal oxide nanostructures on the substrate, wherein the metal oxide nanostructures are crystalline with crystal facets;
heating the substrate formed with the metal oxide nanostructures to over 50° C. in a vacuum chamber; and
depositing a metal in the vacuum chamber after the substrate reaches an elevated substrate temperature over 50° C., to grow metal nanoparticles on the crystal facets of the metal oxide nanostructures at the elevated substrate temperature;
wherein, during depositing the metal in the vacuum chamber, the substrate is maintained at the elevated substrate temperature.

16. The method according to claim 15, wherein, during depositing the metal in the vacuum chamber, a base growth pressure of the vacuum chamber is below $10^{-6}$ Torr.

17. The method according to claim 15, wherein the elevated substrate temperature is a range of 100° C. to 300° C.; and
the elevated substrate temperature is maintained within the range during depositing the metal in the vacuum chamber.

18. The method according to claim 15, wherein depositing the metal in the vacuum chamber is carried out by an evaporation process.

19. A method of fabricating metal nanoparticles on metal oxide nanostructures, comprising:
providing a substrate;
forming metal oxide nanostructures on the substrate, wherein the metal oxide nanostructures are crystalline with crystal facets;
heating the substrate formed with the metal oxide nanostructures to over 50° C. in a vacuum chamber; and
depositing a metal in the vacuum chamber after the substrate reaches an elevated substrate temperature over 50° C., to grow metal nanoparticles on the crystal facets of the metal oxide nanostructures at the elevated substrate temperature;
wherein, during depositing the metal in the vacuum chamber, the substrate is maintained at the elevated substrate temperature, and the elevated substrate temperature is in a range of 100° C. to 300° C.; and
during depositing the metal in the vacuum chamber, a base growth pressure of the vacuum chamber is below 106 Torr.

* * * * *